(12) United States Patent
Henson

(10) Patent No.: US 7,554,153 B2
(45) Date of Patent: Jun. 30, 2009

(54) POWER SEMICONDUCTOR DEVICE

(75) Inventor: Timothy D. Henson, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 114 days.

(21) Appl. No.: 11/715,223

(22) Filed: Mar. 7, 2007

(65) Prior Publication Data
US 2007/0210356 A1  Sep. 13, 2007

Related U.S. Application Data

(60) Provisional application No. 60/779,834, filed on Mar. 7, 2006.

(51) Int. Cl.
*H01L 29/76* (2006.01)
(52) U.S. Cl. ........................ 257/330; 257/331; 257/341; 257/E29.257
(58) Field of Classification Search ................. 257/330, 257/331, 333, 339–342, E29.26, E29.256, 257/E29.257
See application file for complete search history.

(56) References Cited

U.S. PATENT DOCUMENTS

| | | | |
|---|---|---|---|
| 5,326,711 A | 7/1994 | Malhi | |
| 5,998,833 A | 12/1999 | Baliga | |
| 6,049,104 A * | 4/2000 | Hshieh et al. | ............... 257/328 |
| 6,262,453 B1 * | 7/2001 | Hshieh | ...................... 257/341 |
| 6,750,105 B2 | 6/2004 | Disney | |
| 6,882,005 B2 | 4/2005 | Disney | |
| 7,091,080 B2 * | 8/2006 | Spring et al. | ............... 438/212 |
| 2003/0132460 A1 | 7/2003 | Tabuchi et al. | |
| 2004/0065920 A1 * | 4/2004 | Henson | ..................... 257/330 |
| 2007/0132014 A1 * | 6/2007 | Hueting | ..................... 257/329 |
| 2007/0210356 A1 | 9/2007 | Henson | |

FOREIGN PATENT DOCUMENTS

WO    WO 02/13257 A2    4/2007

OTHER PUBLICATIONS

Office Actions issued in U.S. Appl. No. 11/110,467 on Oct. 12, 2007 and Nov. 2, 2007.
International Search Report issued Dec. 15, 2005 in PCT Application Serial No. PCT/US05/22917.
German Office Action dated Apr. 30, 2007 in German Application Serial No. 11 2005 001 434.7-33 and Summary of the Office Action in English.

* cited by examiner

*Primary Examiner*—Tuan N. Quach
(74) *Attorney, Agent, or Firm*—Ostrolenk, Faber, Gerb & Soffen, LLP

(57) ABSTRACT

A power semiconductor device which includes an implant region in the base region thereof to reduce Qgd.

17 Claims, 3 Drawing Sheets

POWER SEMICONDUCTOR DEVICE

RELATED APPLICATION

This application is based on and claims benefit of U.S. Provisional Application No. 60/779,834, filed on Mar. 7, 2006, entitled Qgd Reduction Implant for MOSFETs, to which a claim of priority is hereby made and the disclosure of which is incorporated by reference.

FIELD OF INVENTION

The present invention relates to power semiconductor devices and more particularly to MOSgated power semiconductor devices.

BACKGROUND OF THE INVENTION

The breakdown voltage and the operating resistance (On resistance or Rdson) are important characteristics of a power semiconductor device. The Rdson and the breakdown voltage of a power semiconductor device are inversely related. That is, the improvement in one adversely affects the other. To overcome this problem, U.S. Pat. No. 5,998,833 proposes a trench type power semiconductor in which buried electrodes are disposed within the same trench as the gate electrodes in order to deplete the common conduction region under reverse voltage conditions, whereby the breakdown voltage of the device is improved. As a result, the resistivity of the common conduction region can be improved without an adverse affect on the breakdown voltage.

Referring to FIG. 1, a power semiconductor device according to the disclosure of PCT/US2005/022917, assigned to the assignee of the present application, is a trench type MOSFET, which in the active area thereof includes trench 10 in semiconductor body 56. Trench 10 extends from the top 14 of semiconductor body 56 through source regions 16, and base region 18 into drift region 20.

A device according to FIG. 1 includes: first gate electrode 22 adjacent one sidewall of trench 10 and spanning base region 18; second gate electrode 24 adjacent the opposing sidewall of trench 10 and spanning base region 18; first gate insulation 26 interposed between base region 18 and first gate electrode 22; second gate insulation 28 interposed between second gate electrode 24 and base region 18; and source field electrode 30 having a first portion disposed between first and second gate electrodes 22, 24 and a second portion disposed below first and second gate electrodes 22, 24. First gate electrode 22 and second gate electrode 24 are electrically connected to one another so that they may be activated together, but are insulated from source field electrode 30. Specifically, the first portion of source field electrode 30 is insulated from first and second gate electrodes 22, 24 by respective insulation bodies 32, and insulated from drift region 20 by bottom insulation body 34, which is preferably thicker than first and second gate insulations 26, 28. Preferably, bottom insulation body 34 extends underneath first and second gate electrodes 22, 24.

The device further includes source contact 36 which is electrically connected to source regions 16, source field electrode 30, and high conductivity contact regions 38 in base region 18. To insulate gate electrodes 24, 26 from source contact 36, first insulation cap 40 is interposed between source contact 36 and first gate electrode 22, and second insulation cap 42 is interposed between source contact 36 and second gate electrode 24. Thus, the device according to FIG. 1 includes two insulated gate electrodes, and a source field electrode which is electrically connected to the source contact and disposed between the two gate electrodes and extends to a position below the gate electrodes.

Semiconductor body 56 is preferably comprised of silicon, which is epitaxially formed over a semiconductor substrate 58, such as a silicon substrate. The device further includes drain contact 43, which is in ohmic contact with substrate 58, whereby vertical conduction between source contact 36 and drain contact 43 is made possible.

A device according to FIG. 1 can have a drift region with an increased doping concentration compared to a standard trench MOSFET of the same voltage rating. It has been observed that in a device according to FIG. 1 the depleted region extends significantly into the channel region, which creates a large region of overlap between the gate oxide and the drain, leading to high Qgd, even though the bottom of the gate poly is planar with the pn-junction.

There are several known methods to reduce Qgd.
1. For example, increasing the gate oxide thickness can reduce Qgd. The gate oxide thickness, however, also determines the device threshold voltage, and a thicker oxide will result in higher on-resistance.
2. To reduce Qgd the gate oxide to drift region (drain) overlap can be reduced based on the zero-bias pn junction depth. However, once the bottom of the gate is above the pn junction the device on-resistance will increase. It is also difficult to control the absolute trench depth.
3. The concentration of dopants in the drift region can be reduced to reduce Qgd, which would increase the device on-resistance significantly.

SUMMARY OF THE INVENTION

A MOSgated power semiconductor device according to the present invention includes an active area including at least one active cell, the active cell including at least one source region, a source contact electrode connected to the source region, an insulated gate electrode, a base region of one conductivity formed adjacent a drift region of another conductivity, and a Qgd implant region of the same conductivity as the base region formed in the base region and spaced from the insulated gate electrode, wherein the resistivity and the position of the Qgd implant region are selected to hinder the movement of a depletion region into the base region without affecting the threshold voltage of the device.

The following are some of the advantages of providing a Qgd implant according to the present invention.
1. Qgd is reduced significantly (e.g. about 40% in a simulated case).
2. Device on-resistance is not impacted significantly, since the Qgd implant is spaced some distance from the channel, and does not extend substantially below the channel.
3. Device threshold voltage is not impacted significantly, since the Qgd implant according to the present invention is spaced some distance from the channel.
4. The Qgd implant can be easily added to a device through an implant near the end of the fabrication process, without using an additional mask.

Other features and advantages of the present invention will become apparent from the following description of the invention which refers to the accompanying drawings.

DETAILED DESCRIPTION OF THE FIGURES

Figure 1:
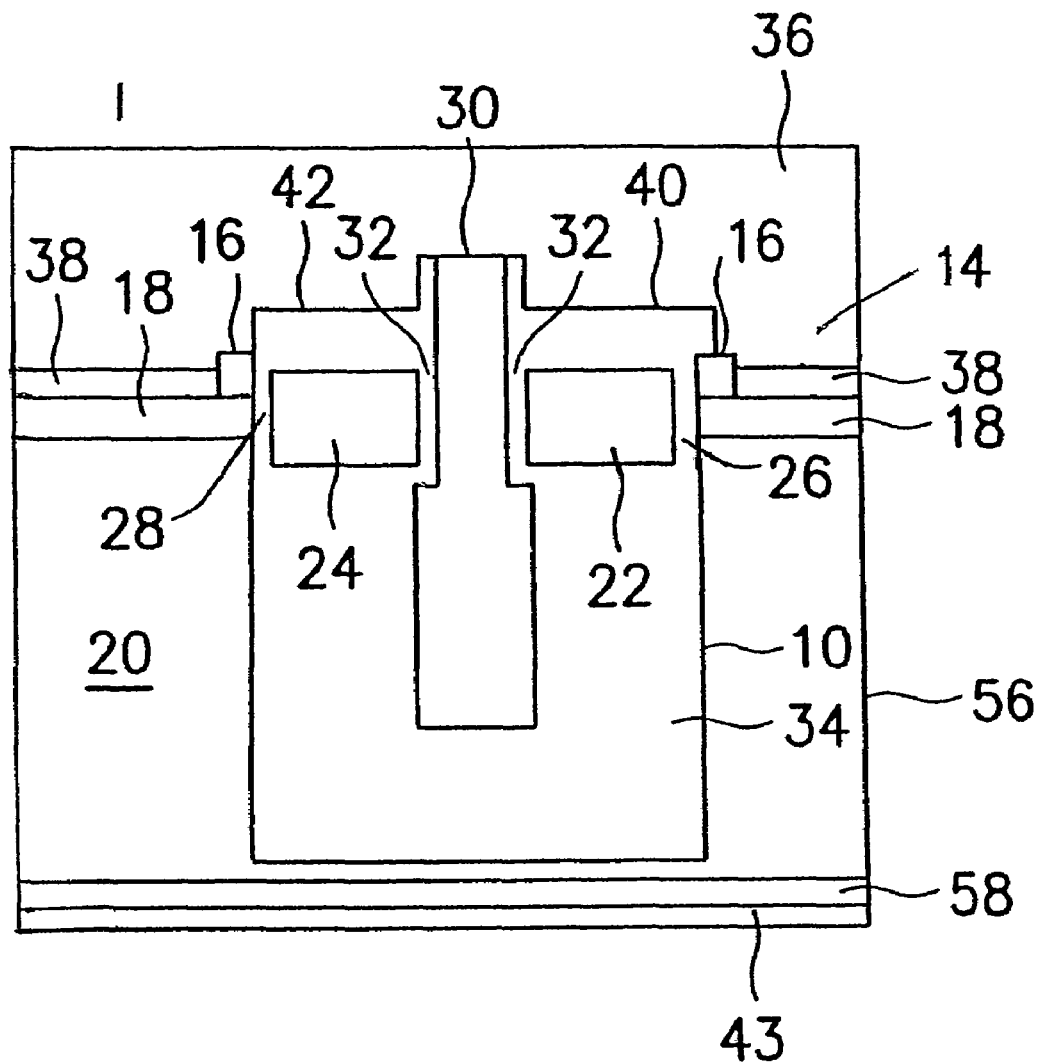
FIG. 1 schematically illustrates a cross-sectional view of a semiconductor device according to a related design.
Figure 2:
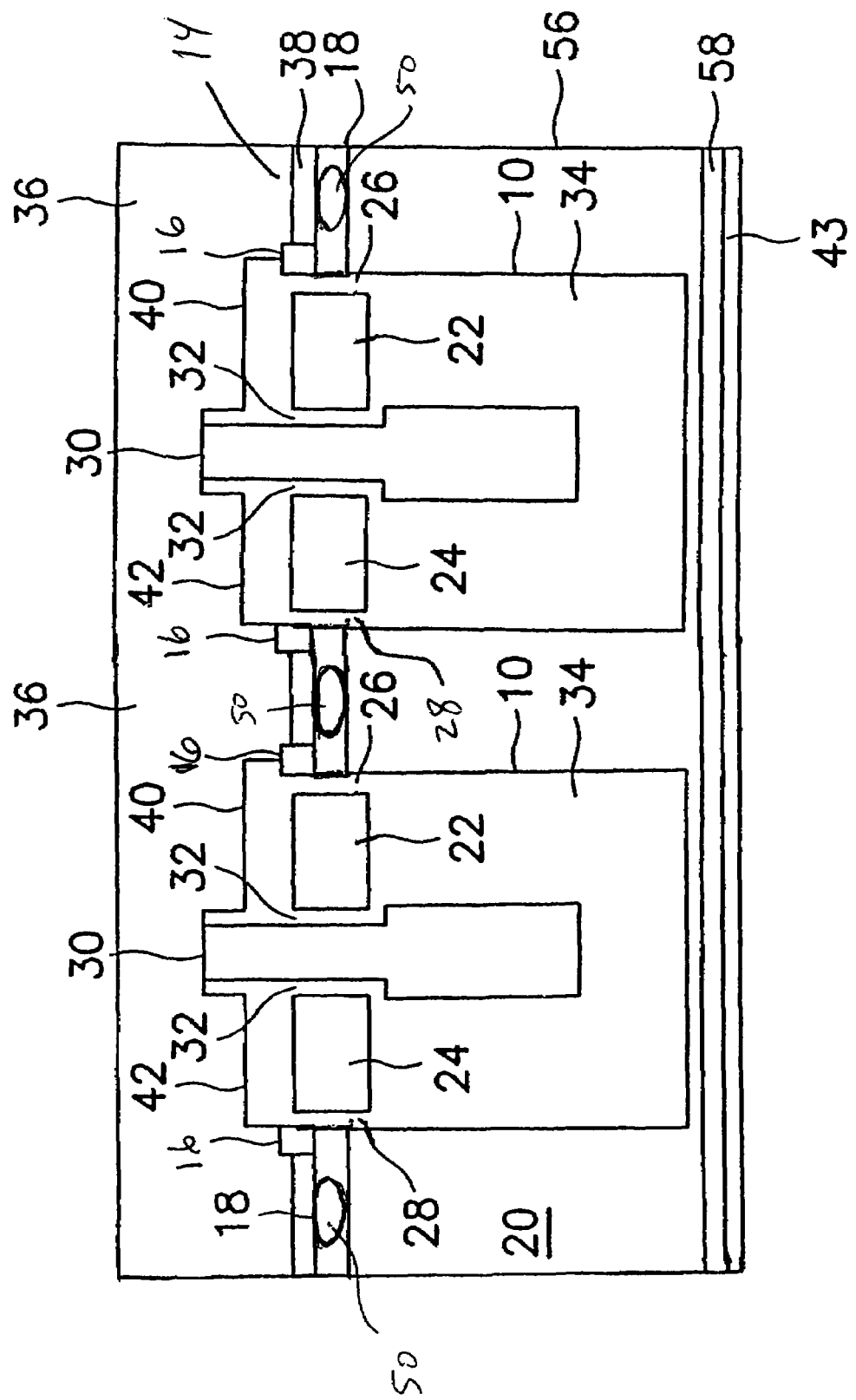
FIG. 2 schematically illustrates a cross-sectional view of a semiconductor device according to the present invention.

Referring to FIG. 2, a power semiconductor device according to the preferred embodiment of the present invention is a trench type MOSFET, which in the active area thereof includes trench 10 in semiconductor body 56. Trench 10 extends from the top 14 of semiconductor body 56 through source regions 16, and base region 18 into drift region 20. Trench 10 is preferably stripe shaped, but may also be cellular.

The preferred embodiment further includes: first gate electrode 22 adjacent one sidewall of trench 10 and spanning base region 18; second gate electrode 24 adjacent the opposing sidewall of trench 10 and spanning base region 18; first gate insulation 26 interposed between base region 18 and first gate electrode 22; second gate insulation 28 interposed between second gate electrode 24 and base region 18; and source field electrode 30 having a first portion disposed between first and second gate electrodes 22, 24 and a second portion disposed below first and second gate electrodes 22, 24. First gate electrode 22 and second gate electrode 24 are electrically connected to one another so that they may be activated together, but are insulated from source field electrode 30. Specifically, the first portion of source field electrode 30 is insulated from first and second gate electrodes 22, 24 by respective insulation bodies 32, and insulated from drift region 20 by bottom insulation body 34, which is preferably thicker than first and second gate insulations 26, 28. Preferably, bottom insulation body 34 extends underneath first and second gate electrodes 22, 24. Note that it is possible to arrange the source field electrode 30 planar with the gate electrodes 22, 24 and covered with an insulation cap. Thus, the top surface (surface opposite the bottom surface which is closest to the bottom of trench 10) of source field electrode 30 may be coplanar with the top surfaces of gate electrodes 22, 23. Note that the top surfaces of source field electrodes 30 may be locally insulated from source contact 36 with an insulation body, but electrically connected to the same in a bus region (outside of the region in which the active cells reside).

The preferred embodiment further includes source contact 36 which is electrically connected to source regions 16, source field electrode 30, and high conductivity contact regions 38 in base region 18. To insulate gate electrodes 24, 26 from source contact 36, first insulation cap 40 is interposed between source contact 36 and first gate electrode 22, and second insulation cap 42 is interposed between source contact 36 and second gate electrode 24.

In the preferred embodiment of the present invention, the first portion of source field electrode 30 extends out of trench 10 and above surface 14 of semiconductor body 56. It should be noted that caps 40, 42 may also extend out of trench 10 and above surface 14 of semiconductor body 56.

Semiconductor body 56 is preferably comprised of silicon, which is epitaxially formed over a semiconductor substrate 58, such as a silicon substrate. The preferred embodiment further includes drain contact 43, which is in ohmic contact with substrate 58, whereby vertical conduction between source contact 36 and drain contact 43 is made possible. As would be readily apparent to a skilled person, source regions 16 would be of the same conductivity as drift region 20 and substrate 58, e.g. N-type, while base region 18 and high conductivity contact regions 38 are of another conductivity, e.g. P-type. Also, in the preferred embodiment, first and second gate electrodes 22, 24 and source field electrode 30 are composed of conductive polysilicon, and gate insulations 26, 28, insulation caps 40, 42, insulation bodies 32, and bottom insulation body 34 are composed of silicon dioxide.

Preferably, source contact 36, and drain contact 42 are composed of any suitable metal such as aluminum or aluminum silicon.

A device according to the present invention includes a Qgd implant region 50 inside base region 18 under a high conductivity contact region 38. The conductivity of Qgd implant 50 is the same conductivity type as that of base region 18, but has a concentration higher than that of base region 18, and Qgd implant 50 is preferably contained within base region 18. Note that it would be important to position each Qgd implant 50 far enough from the gate trench so that its presence does not adversely affect the threshold voltage. However, if the width of the Qgd must be selected so that its boundaries are not so far from the gate trenches such that it does not positively affect the Qgd according to the concept described herein. A skilled person would recognize that the concentration, the width and the position of a Qgd according to the present invention may vary from device to device, and this must be obtained either analytically or experimentally in each given design. Qgd implant 50 according to the present invention can be formed by implanting dopants after forming high conductivity regions 38. Thus, Qgd implants 50 may be aligned with regions 38. Also, the concentration of dopants in Qgd implants 50 should be selected to prevent significant encroachment of the depletion region into base region 18.

In one example, a Qgd implant having a peak concentration of about 1×E18 was formed with a 120 KeV Boron implant after high conductivity contact regions 38. It was observed in that example that by providing a Qgd implant the depletion region did not extend as far into base region 18 than observed in prior art devices resulting in a lower Qgd.

Figure 3:
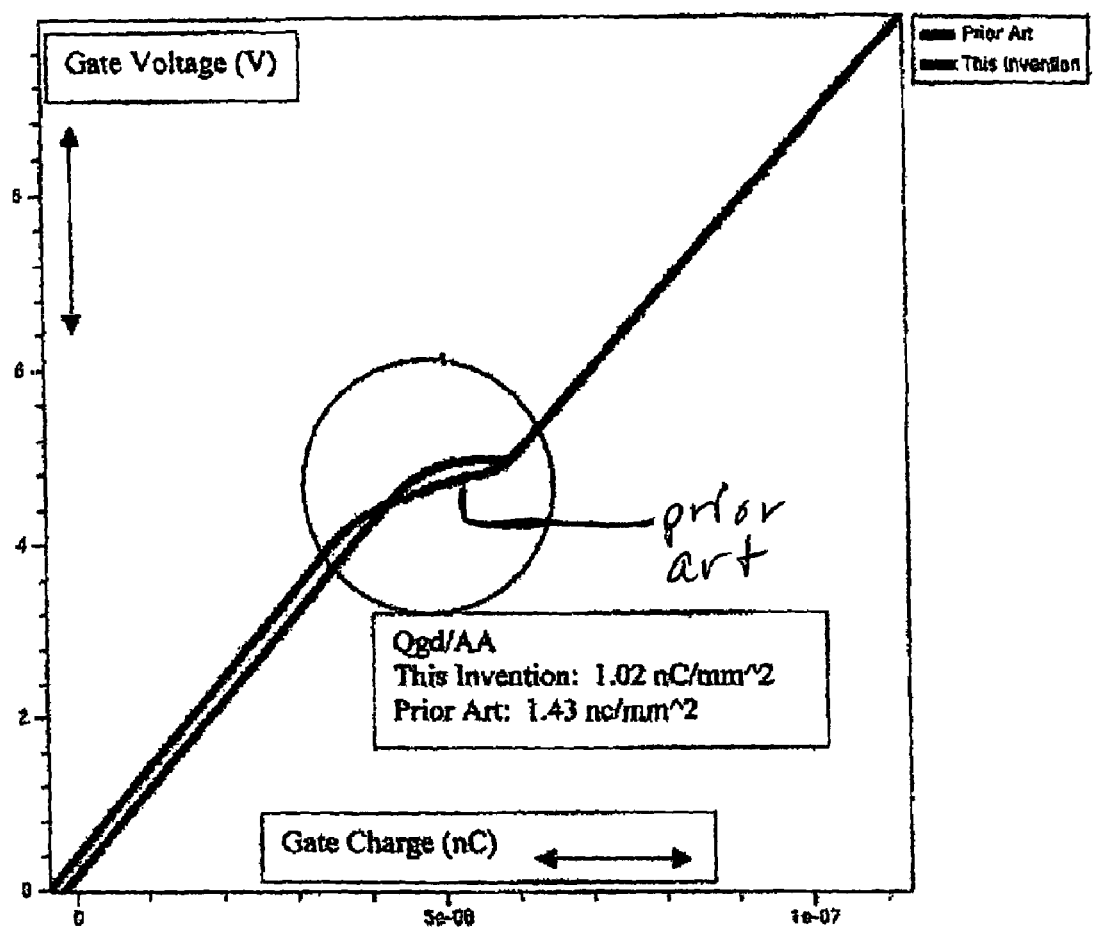
FIG. 3 graphically illustrates gate charge vs. gate voltage performance of a device according to the present invention compared to a prior art device.

FIG. 3 graphically compares the performance of a device according to the present invention (the higher curve within the circle) to a prior art device at Vds=50V. It can be seen that a device according to the present invention exhibits significantly lower Qgd.

Table 1 below provides a set of values to determine the required concentration of dopants for a Qgd implant region 50. For example, in the case of a device with a breakdown voltage of ~100V and using a drift region (N) concentration of 2.3×E16, it is desirable to use a concentration (P) of >2×E$^{17}$ to minimize the depletion into the Channel <0.185 μm.

TABLE 1

| N | P | p-Dep1(50 V) μm |
|---|---|---|
| 2.30E+16 | 5.00E+16 | 0.646 |
| 2.30E+16 | 1.00E+17 | 0.352 |
| 2.30E+16 | 1.50E+17 | 0.242 |
| 2.30E+16 | 2.00E+17 | 0.185 |
| 2.30E+16 | 5.00E+17 | 0.076 |
| 2.30E+16 | 1.00E+18 | 0.039 |

A Qgd implant according to the present invention is especially suited for use in the deep source field electrode type structure according to the preferred embodiment that would otherwise suffer from high Qgd because of the increase drift region doping concentration and increased depletion into the channel. The addition of a Qgd implant region according to the present invention allows Qgd to remain about the same as a conventional trench device while taking advantage of the much lower on-resistance of the deep source filed electrode.

It should be noted, however, that the addition of a Qgd implant according to the present invention is equally applicable to conventional low voltage (<300V) trench devices without the deep source electrode as a simple means of reducing Qgd.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
    a semiconductor body having a conduction region of one conductivity, and a base region of another conductivity, said semiconductor body including a first surface;
    a trench extending from said first surface through said base region and into said conduction region, said trench including at least two opposing sidewalls and a bottom;
    a first gate insulation adjacent one of said sidewalls;
    a first gate electrode adjacent said first gate insulation and spanning said base region;
    a source region adjacent at least one sidewall of said trench;
    a contact region of said another conductivity adjacent said source region;
    a source contact electrically connected to said source region and said contact region; and
    a Qgd implant region of said another conductivity inside and contained within said base region and disposed directly below and aligned with said contact region, wherein said Qgd implant varies the resistivity of said base region, whereby the resistivity of said base region adjacent said first gate insulation is higher than the resistivity of said Qgd implant region and said Qgd implant is positioned to retard the encroachment of a depletion region into said base region without varying the threshold voltage of the device.

2. A semiconductor device according to claim 1, wherein said semiconductor body is comprised of epitaxial silicon.

3. A power semiconductor device comprising:
    a semiconductor body having a conduction region of one conductivity, and a base region of another conductivity, said semiconductor body including a first surface;
    a trench extending from said first surface through said base region and into said conduction region, said trench including at least two opposing sidewalls and a bottom;
    a first gate insulation adjacent one of said sidewalls;
    a first gate electrode adjacent said first gate insulation and spanning said base region;
    a source region adjacent at least one sidewall of said trench;
    a source contact electrically connected to said source region;
    a Qgd implant region of said another conductivity in said base region to vary the resistivity of said base region, whereby the resistivity of said base region adjacent said first gate insulation is higher than the resistivity of said Qgd implant region and said Qgd implant is positioned to retard the encroachment of a depletion region into said base region without varying the threshold voltage of the device;
    a second gate insulation adjacent the other of said sidewalls;
    a second gate electrode adjacent said second gate insulation and spanning said base region; and
    a source field electrode having a first portion and a second portion, said first portion of said source field electrode being disposed between said first and said second gate electrodes and insulated from the same by an insulation body, and said second portion of said source field electrode being disposed below said first portion and said gate electrodes, wherein said source contact is electrically connected to said source field electrode.

4. A semiconductor device according to claim 3, further comprising a first insulation cap interposed between said source contact and said first gate electrode and a second insulation cap interposed between said source contact and said second gate electrode, wherein said source field electrode is disposed between said first insulation cap and said second insulation cap.

5. A semiconductor device according to claim 3, wherein said source field electrode extends out of said trench and above said first surface of said semiconductor body.

6. A semiconductor device according to claim 3, further comprising a bottom insulation body disposed between said second portion of said source field electrode and said sidewalls and said bottom of said trench.

7. A semiconductor device according to claim 6, wherein said bottom insulation body is thicker than said gate insulations.

8. A semiconductor device according to claim 6, wherein said bottom insulation body is disposed below both gate electrodes.

9. A semiconductor device according to claim 3, wherein said source field electrode is comprised of conductive polysilicon.

10. A semiconductor device according to claim 3, wherein said gate electrodes are comprised of conductive polysilicon.

11. A semiconductor device according to claim 10, wherein said epitaxial silicon is formed over a silicon substrate, and further comprising a drain contact ohmically connected to said silicon substrate.

12. A semiconductor device according to claim 3, wherein a top surface of said source field electrode is coplanar with top surfaces of said gate electrodes.

13. A MOSgated power semiconductor device comprising:
    an active area including at least one active cell, said active cell including at least one source region, a contact region adjacent said source region, a source contact electrode connected to said source region and said contact region, an insulated gate electrode, a base region of one conductivity formed adjacent a drift region of another conductivity, and a Qgd implant of the same conductivity as said base region formed directly below said contact region and contained within said base region and spaced from said insulated gate electrode, wherein the resistivity and the position of said Qgd implant region are selected to hinder the movement of a depletion region into said base region without affecting the threshold voltage of the device.

14. A device according to claim 13, further comprising a drain contact disposed opposite said source contact.

15. A MOS gated power semiconductor device comprising:
    an active area including at least one active cell, said active cell including at least one source region, a source contact electrode connected to said source region, an insulated gate electrode, a base region of one conductivity formed adjacent a drift region of another conductivity, a Qgd implant of the same conductivity as said base region formed in said base region and spaced from said insulated gate electrode, wherein the resistivity and the position of said Qgd implant region are selected to hinder the movement of a depletion region into said base region without affecting the threshold voltage of the device, and an insulated source field electrode extending below said insulated gate electrode and electrically connected to said source contact.

16. A device according to claim 15, wherein said source field electrode extends to a height above said insulated gate electrode.

17. A device according to claim 15, wherein a top surface of said source field electrode is coplanar with a top surface of said gate electrode.

* * * * *